(12) United States Patent
Futase

(10) Patent No.: US 11,114,157 B1
(45) Date of Patent: Sep. 7, 2021

(54) LOW RESISTANCE MONOSILICIDE ELECTRODE FOR PHASE CHANGE MEMORY AND METHODS OF MAKING THE SAME

(71) Applicant: Western Digital Technologies, Inc., San Jose, CA (US)

(72) Inventor: Takuya Futase, Nagoya (JP)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 16/857,053

(22) Filed: Apr. 23, 2020

(51) Int. Cl.
*G11C 11/00* (2006.01)
*G11C 13/00* (2006.01)
*H01L 45/00* (2006.01)

(52) U.S. Cl.
CPC ........ *G11C 13/0004* (2013.01); *G11C 13/003* (2013.01); *G11C 13/0026* (2013.01); *G11C 13/0028* (2013.01); *H01L 45/06* (2013.01); *H01L 45/1608* (2013.01); *H01L 45/1675* (2013.01)

(58) Field of Classification Search
CPC . G11C 11/00; G11C 13/0004; G11C 13/0026; G11C 13/0028; G11C 13/003; H01L 45/06; H01L 45/1608; H01L 45/1675

USPC ........................................................ 365/163
See application file for complete search history.

(56) References Cited

U.S. PATENT DOCUMENTS

| 8,110,457 | B2 | 2/2012 | Futase | |
|---|---|---|---|---|
| 8,679,961 | B2 | 3/2014 | Ikeda | |
| 2009/0011566 | A1* | 1/2009 | Okada | H01L 21/76224 438/308 |
| 2011/0237061 | A1* | 9/2011 | Yamaguchi | H01L 21/28052 438/592 |
| 2012/0126297 | A1* | 5/2012 | Yamaguchi | H01L 21/67103 257/288 |

* cited by examiner

*Primary Examiner* — Harry W Byrne
(74) *Attorney, Agent, or Firm* — Vierra Magen Marcus LLP

(57) ABSTRACT

This disclosure relates to a low-resistance monosilicide electrode and method of making the monosilicide electrode. A cell film stack is first formed on a substrate of a wafer. The top layer of this cell film stack is silicon. The cell film stack is then etched to form at least one pillar. Dielectric is deposited to fill the gaps between the pillars. The wafer is then planarized to expose the top silicon layer. The exposed top silicon layer is converted into a nickel monosilicide layer by way of a thermal solid-state reaction between nickel and the silicon layer. This nickel monosilicide layer forms the monosilicide electrode.

8 Claims, 10 Drawing Sheets

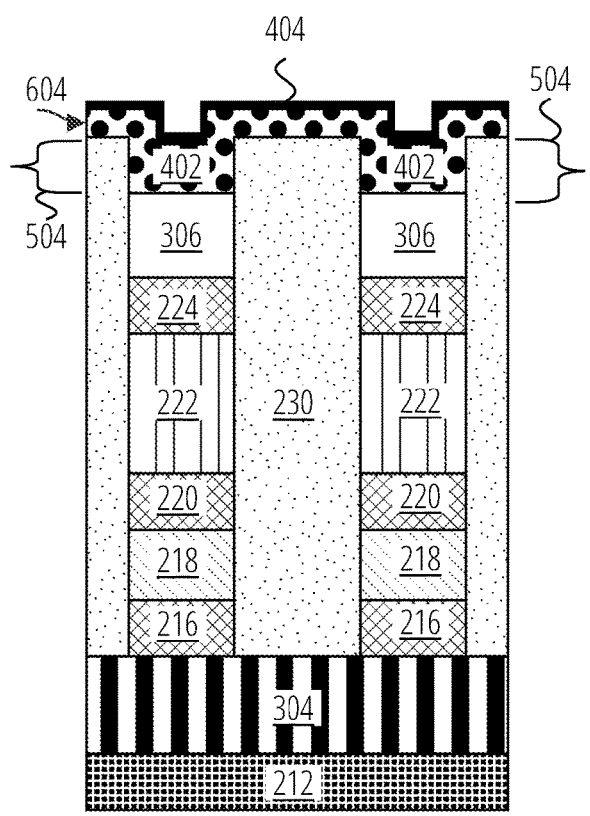
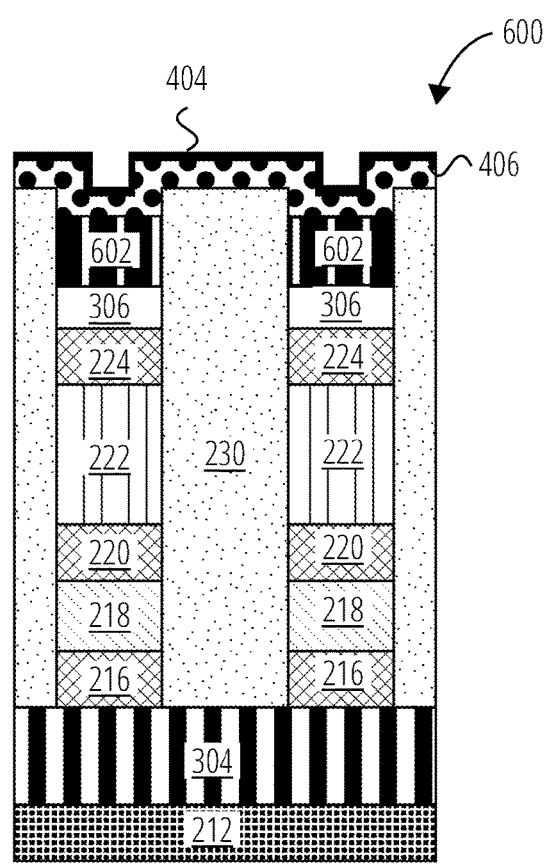
FIG. 6A
FIG. 6B
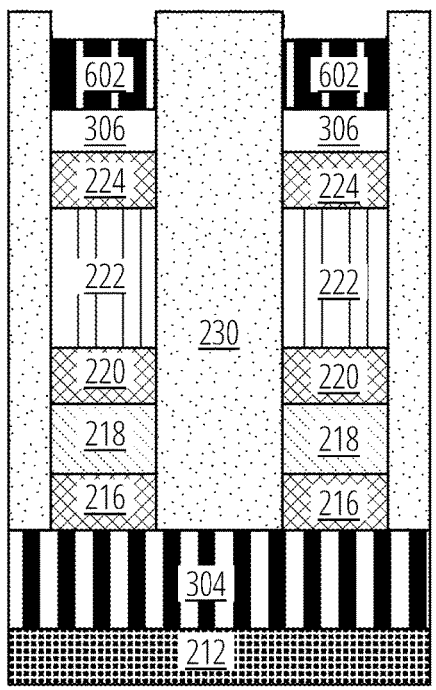
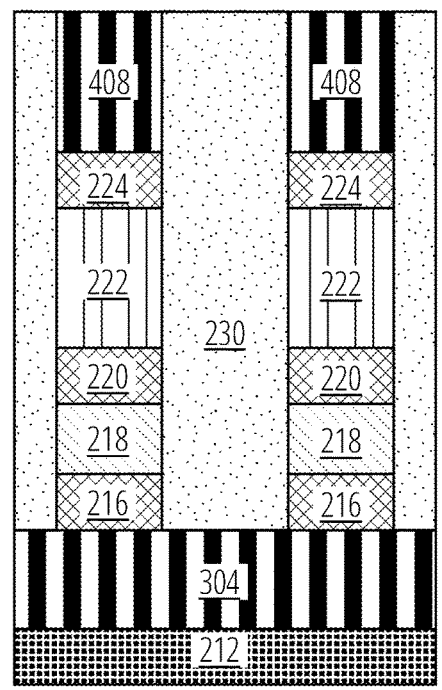
FIG. 6C
FIG. 6D

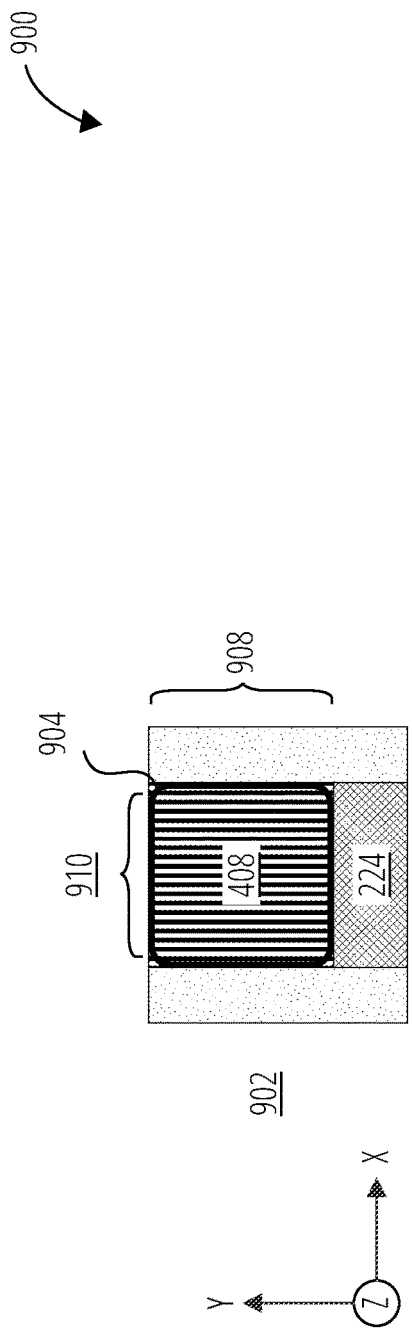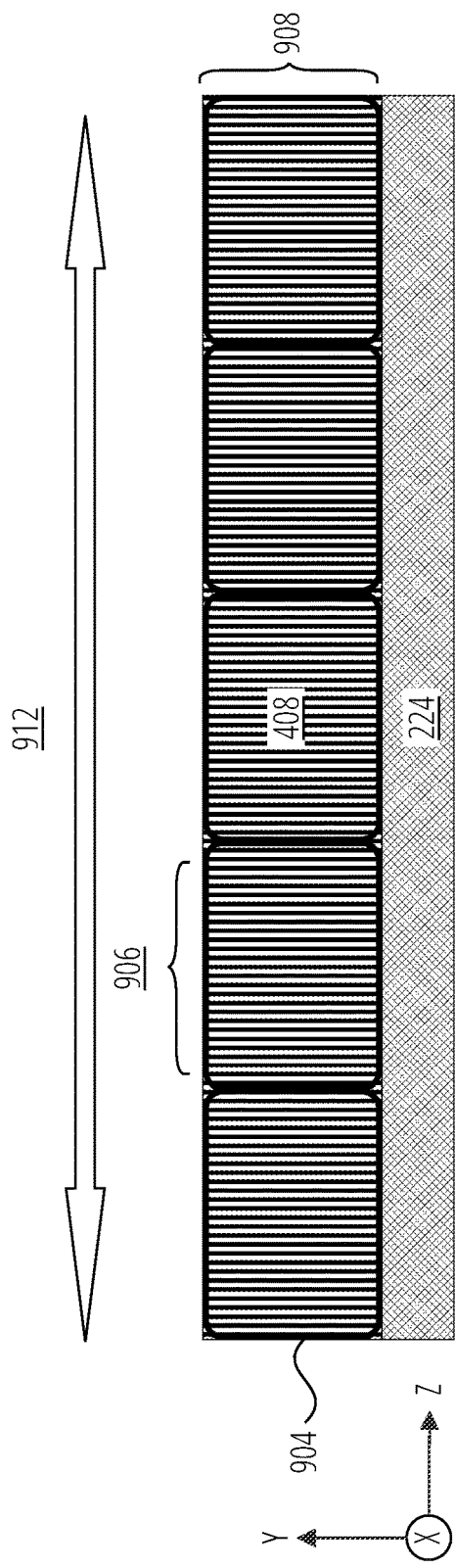

LOW RESISTANCE MONOSILICIDE ELECTRODE FOR PHASE CHANGE MEMORY AND METHODS OF MAKING THE SAME

BACKGROUND

Narrow wire effect in conductive materials limits how small electrodes and wires on semiconductor devices may be created through conventional manufacturing techniques. Control signals intended for transmission on these electrodes and wires necessitate that conductor resistance be kept as low as possible to achieve the high signal speeds and low power consumption needed to implement ever smaller chip designs.

Resistance is a physical property of a conductor that relates to both the conductor's material composition and dimensions. For a given low-resistance material, such as a metal, two conductors of equal length and cross-sectional area may exhibit an equal resistance, while a conductor with a greater length and the same cross-sectional area, or one with the same length but a smaller cross-sectional area, may exhibit a higher resistance. Thus, the smaller cross-sectional areas needed to fit conductive paths into smaller chip designs may lead to increases in resistance. This increased resistance degrades a signal traversing the conductive path and results in more power dissipation across the path.

One potential solution is to anneal the electrode material. Annealing has the effect of consolidating small grains within the material into larger grains. This reduces the number of grain boundaries within the wire structure, thereby improving the conductivity and reducing the reflective and degradative effects that occur as signals traverse grain boundaries.

This is not practical, however, for certain materials such as tungsten (W), which is a common material used in electrodes for conventionally constructed semiconductor memory devices and/or memory arrays. To be effective the annealing is done at very high temperatures for the particular material being used. Tungsten, as a metal with a very high melting point, needs to be annealed at temperatures above 850° C. However, such high temperatures are impractical in manufacturing semiconductors which contain ovonic threshold switch (OTS) layers, as OTS is not thermostable, and would be damaged or degraded by an annealing process suitable for tungsten.

An alternative material, nickel monosilicide (NiSi) may be used in place of tungsten. Nickel monosilicide has a low resistivity and a lower narrow wire effect than tungsten. Other metal silicides may also exhibit these properties. However, methods for creating NiSi and other metal silicide wires using conventional subtractive wire fabrication do not currently exist. Dry etching is not feasible because an effective dry etchant gas for these materials has not been developed. Metal silicide wires and electrodes may be fabricated by a process called silicidation, wherein adjacent regions of a suitable metal and silicon may chemically combine through a thermal solid-state reaction to form the metal silicide. There is, therefore, a need for methods of inducing and controlling silicidation as part of a wafer fabrication process in order to create conductive metal silicide structures within a semiconductor design.

BRIEF SUMMARY

This disclosure relates to a low-resistance monosilicide electrode and method of making the monosilicide electrode. A cell film stack is formed on a substrate of a wafer. The top layer of this cell film stack is silicon. The top silicon layer is configured and designed such that the silicon layer may serve as an electrode for an integrated semiconductor structure of one or more die fabricated on the wafer. Next, the cell film stack is etched into at least one pillar. Dielectric is deposited to fill the gaps between the pillars. The wafer may then be planarized to expose the top silicon layer. The exposed top silicon layer is converted into a nickel monosilicide layer by supplying nickel and performing a silicidation process. This layer forms the monosilicide electrode.

This disclosure relates further to another method of forming a monosilicide electrode. A cell film stack is first formed on a substrate of a wafer, having a top silicon layer. A sacrificial layer is deposited onto the top silicon layer, and the cell film stack is etched into pillars. Dielectric is deposited to fill the gaps between pillars. The wafer is planarized to expose a predefined thickness of the sacrificial layer. The sacrificial layer is then removed. Next, nickel is deposited to form a nickel layer. The wafer is annealed to form a di-nickel silicide layer between the nickel layer and the top silicon layer. Wet etching is used to remove unreacted nickel from the nickel layer and expose the di-nickel silicide layer. Finally, the wafer is annealed to form a nickel monosilicide layer from the di-nickel silicide layer and the top silicon layer. The nickel monosilicide layer forms the monosilicide electrode.

Finally, this disclosure relates to a phase change memory device. The phase change memory device comprises a selector connected in series with a phase change storage cell and a word line. A bit line is connected in series to the phase change storage cell. One or more of the bit line and the word line comprise a monosilicide electrode.

BRIEF DESCRIPTION OF THE SEVERAL VIEWS OF THE DRAWINGS

To easily identify the discussion of any particular element or act, the most significant digit or digits in a reference number refer to the figure number in which that element is first introduced. In addition, like elements are referred to by a common reference numeral to facilitate understanding. Where cross-sections are illustrated and reference numerals are used, the same reference numeral used in different figures and/or embodiments represents a layer made from the same material as first defined and associated with that reference numeral. For clarity, certain layers in cross-sectional views may not have a reference numeral. In such instances, the fill pattern used for a particular layer matches the fill pattern used on a layer having a reference numeral and thus the two layers are both made from the same material or material compound.

FIGS. 6A-D illustrate process cross-sectional views 600 in in accordance with the embodiment of FIGS. 5A-D.

FIGS. 9A-B illustrate cross-sectional views of a low resistance monosilicide electrode 900 in accordance with one embodiment.

DETAILED DESCRIPTION

Aspects of the solution disclosed herein form metal silicide structures as part of an integrated semiconductor die on wafer fabrication process. Nickel, which may be used to create nickel monosilicide, may be selected based on the conductivity of NiSi and the relative low cost of nickel. However, other metals such as platinum, cobalt, and vanadium may also be used in the disclosed solution. Use of nickel in descriptive text and illustrations is not intended to limit this solution to use of nickel.

NiSi and other materials may, then, be used to construct word lines, bit lines, control lines, and other signaling pathways within a cross-point phase charge memory (PCM) cell array. NiSi may provide structures with lower resistivity and greater flexibility and thermal and structural stress tolerance over the life of the device, even when used to implement very narrow wires. The germanium-antimony-tellurium (Ge—Sb—Te or SGT) structures within the semiconductor heat and cool, during operation, the monosilicide electrode is more pliable than convention metals, such as tungsten used as electrodes. Consequently, the use of monosilicide electrodes may reduce or eliminate a risk of breaks or shorts in the monosilicide electrode in comparison to tungsten electrodes of similar dimensions.

Methods are disclosed for forming wires and electrodes from NiSi or other metal silicides. An annealing process may be used to form a metal silicide conductor with larger grain structure at temperatures low enough to preserve the integrity of OTS structures within the wafer, which may not be possible with conventional materials such as tungsten.

Figure 1:
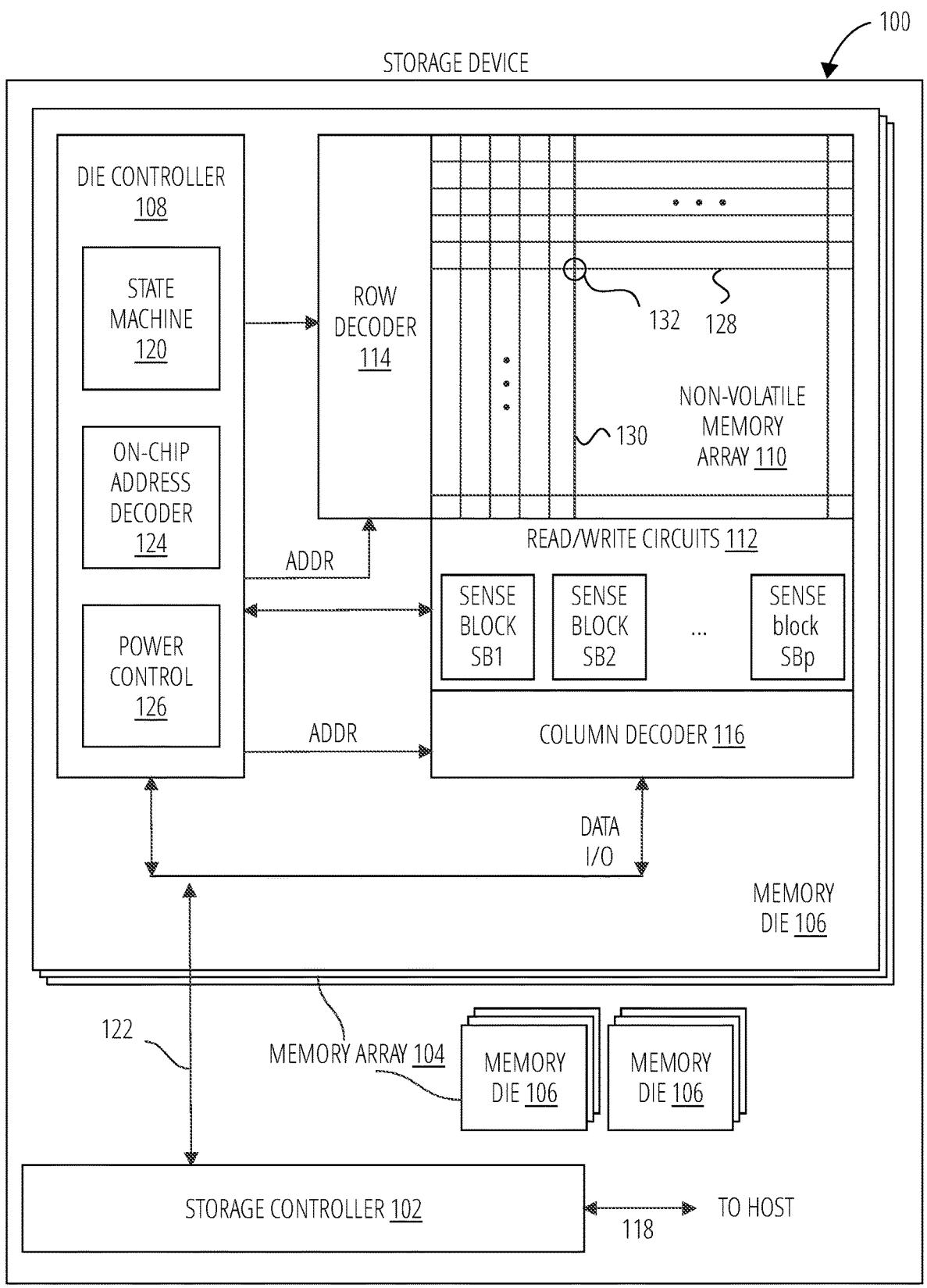
FIG. 1 illustrates a storage device 100 in accordance with one embodiment.

FIG. 1 is a block diagram of an exemplary storage device 100. "Storage device" refers to any hardware, system, subsystem, circuit, component, module, non-volatile memory media, hard disk drive, storage array, device, or apparatus configured, programmed, designed, or engineered to store data for a period of time and retain the data in the storage device while the storage device is not using power from a power supply. "Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

The storage device 100 may include a storage controller 102 and a memory array 104. Each memory die 106 in the memory array 104 may include a die controller 108, at least one non-volatile memory array 110 in the form of a three-dimensional array and read/write circuits 112.

"Non-volatile memory array" refers to a set of non-volatile storage cells (also referred to as memory cells or non-volatile memory cells) organized into an array structure having rows and columns. A memory array is addressable using a row identifier and a column identifier.

"Three-dimensional memory array" refers to a physical arrangement of components of a memory array which contrasts with a two-dimensional (2-D) memory array. 2-D memory arrays are formed along a planar surface of a semiconductor wafer or other substrate. A three-dimensional (3-D) memory array extends up from the wafer surface/substrate and generally includes stacks, or columns, of memory cells extending upwards, in a z-direction. In a 3-D memory array word lines comprise layers stacked one on the other as the memory array extends upwards. Various 3-D arrangements are possible. In one embodiment, a plurality of PCM memory cells may be stacked on each other to form a 3-D arrangement. In one arrangement a NAND string is formed vertically with one end (e.g., source) at the wafer surface and the other end (e.g., drain) on top.

"Threshold voltage" refers to a voltage level that when applied to a gate terminal of a transistor causes the transistor to conduct a current between the drain electrode and source electrode.

Consequently, a non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic. "Memory cell" refers to a type of storage media configured to represent one or more binary values by way of a determinable physical characteristic of the storage media when the storage media is sensed, read, or detected to determine what binary value(s) was last stored in the memory cell. Memory cell and storage cell are used interchangeably herein.

A memory array is addressable using a row identifier and a column identifier. Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells 132 at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

The non-volatile memory array 110 is addressable by word line 128 via a row decoder 114 and by bit line 130 via a column decoder 116. "Word line" refers to a structure within a memory array comprising a set of memory cells. The memory array is configured such that the operational memory cells of the word line are read or sensed during a read operation. Similarly, the memory array is configured such that the operational memory cells of the word line are read, or sensed, during a read operation. A word line may also be referred to as a physical page or page for short. "Bit line" refers to a circuit structure configured to deliver a voltage and/or conduct current to a column of a memory array. A memory array may have one bit line for each memory cell along the word lines of the memory array.

"Select gate" refers to a transistor structurally and/or electrically configured to function as a switch to electrically connect a first electrical structure connected to a source terminal of the transistor to a second electrical structure connected to the drain terminal. When functioning as a switch, the transistor is referred to herein as a 'select gate' and serves to gate (selectively) or control when, and in what quantity, a current flows or a voltage passes between the first electrical structure and the second electrical structure. Depending on the context, references to select gate herein may refer to the whole transistor or to the gate terminal of the transistor.

The read/write circuits 112 include multiple sense blocks SB1, SB2, . . . , SBp (sensing circuitry) and allow a page of memory cells to be read or programmed in parallel. "Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment). In certain embodiments, each memory cell across a row of the memory array together form a physical page. "Read/write circuit" refers to a device, component, element, module, system, sub-system, circuitry, logic, hardware, or circuit configured and/or operational to read data from and write data to a storage media, such as storage cells of a storage array.

"Storage cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein.

A physical page may include memory cells along a row of the memory array for a single plane or for a single memory die. In one embodiment, the memory die includes a memory array made up of two equal sized planes. In one embodiment, a physical page of one plane of a memory die includes four data blocks (e.g., 16 KB). In one embodiment, a physical page (also called a "die page") of a memory die includes two planes each having four data blocks (e.g., 32 KB). Commands and data are transferred between a host and storage controller 102 via a data bus 118, and between the storage controller 102 and the one or more memory dies 106 via bus 122.

The non-volatile memory array 110 can be two-dimensional (2D—laid out in a single fabrication plane) or three-dimensional (3D—laid out in multiple fabrication planes). The non-volatile memory array 110 may comprise one or more arrays of memory cells including a 3D array. In one embodiment, the non-volatile memory array 110 may comprise a monolithic three-dimensional memory structure (3D array) in which multiple memory levels are formed above (and not in) a single substrate, such as a wafer, with no intervening substrates. The non-volatile memory array 110 may comprise any type of non-volatile memory and may be monolithically formed in one or more physical levels of arrays of memory cells having an active area disposed above a silicon substrate. The non-volatile memory array 110 may be in a non-volatile solid-state drive having circuitry associated with the operation of the memory cells, whether the associated circuitry is above or within the substrate.

Within the non-volatile memory array 110, word lines 128 may comprise sections of the layers containing memory cells, disposed in layers above the substrate. Multiple word lines 128 may be formed on single layer by means of trenches or other non-conductive isolating features. Bit lines 130 may comprise electrodes or wires running across one or more layers. Memory cells 132 may be formed at the intersection of a word line 128 layer with an orthogonal column structure connected to a bit line 130.

The die controller 108 cooperates with the read/write circuits 112 to perform memory operations on memory cells of the non-volatile memory array 110, and includes a state machine 120, an address decoder 124, and a power control 126. The state machine 120 provides chip-level control of memory operations. "Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

The address decoder 124 provides an address interface between that used by the host or a storage controller 102 to the hardware address used by the row decoder 114 and column decoder 116. The power control 126 controls the power and voltages supplied to the various control lines during memory operations. "Control line" refers to a structure, circuit, circuitry, and/or associated logic configured to convey an electrical current and/or voltage from a source to a destination. In certain embodiments, analog voltages, currents, biases, and/or digital signals supplied or discharged over a control line are used to control switches, select gates, and/or other electrical components. Certain control lines may have a specific name based on what parts of a circuit the control line controls or where the control line couples, or connects, to other circuits. Examples of named control lines include word lines, bit lines, source control lines, drain control lines, and the like.

"Source control line" refers to a control line configured to operate a select gate (e.g., turn the select gate on, activate, and off, deactivate) for coupling a source side of a NAND string to a source line and/or another circuit. In one embodiment, a source control line couples a selector for a PCM memory cell to a control line, such as a word line or a bit line.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

The power control 126 and/or read/write circuits 112 can include drivers for word lines, source gate select (SGS) transistors, drain gate select (DGS) transistors, bit lines, substrates (in 2D memory structures), charge pumps, and source lines/word lines/bit lines or the like. In certain embodiments, the power control 126 may detect a sudden loss of power and take precautionary actions. The power control 126 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than non-volatile memory array 110, can be thought of as at least one control circuit or storage controller which is configured to perform the techniques described herein. For example, a control circuit may include any one of, or a combination of, die controller 108, state machine 120, address decoder 124, column decoder 116, power control 126, sense blocks SB1, SB2, ..., SBp, read/write circuits 112, storage controller 102, and so forth.

In one embodiment, the host is a computing device (e.g., laptop, desktop, smartphone, tablet, digital camera) that includes one or more processors, one or more processor readable storage devices (RAM, ROM, FLASH memory, hard disk drive, solid state memory) that store processor readable code (e.g., software) for programming the storage controller 102 to perform the methods described herein. The host may also include additional system memory, one or more input/output interfaces and/or one or more input/output devices in communication with the one or more processors, as well as other components well known in the art.

Associated circuitry is typically involved in operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 2:
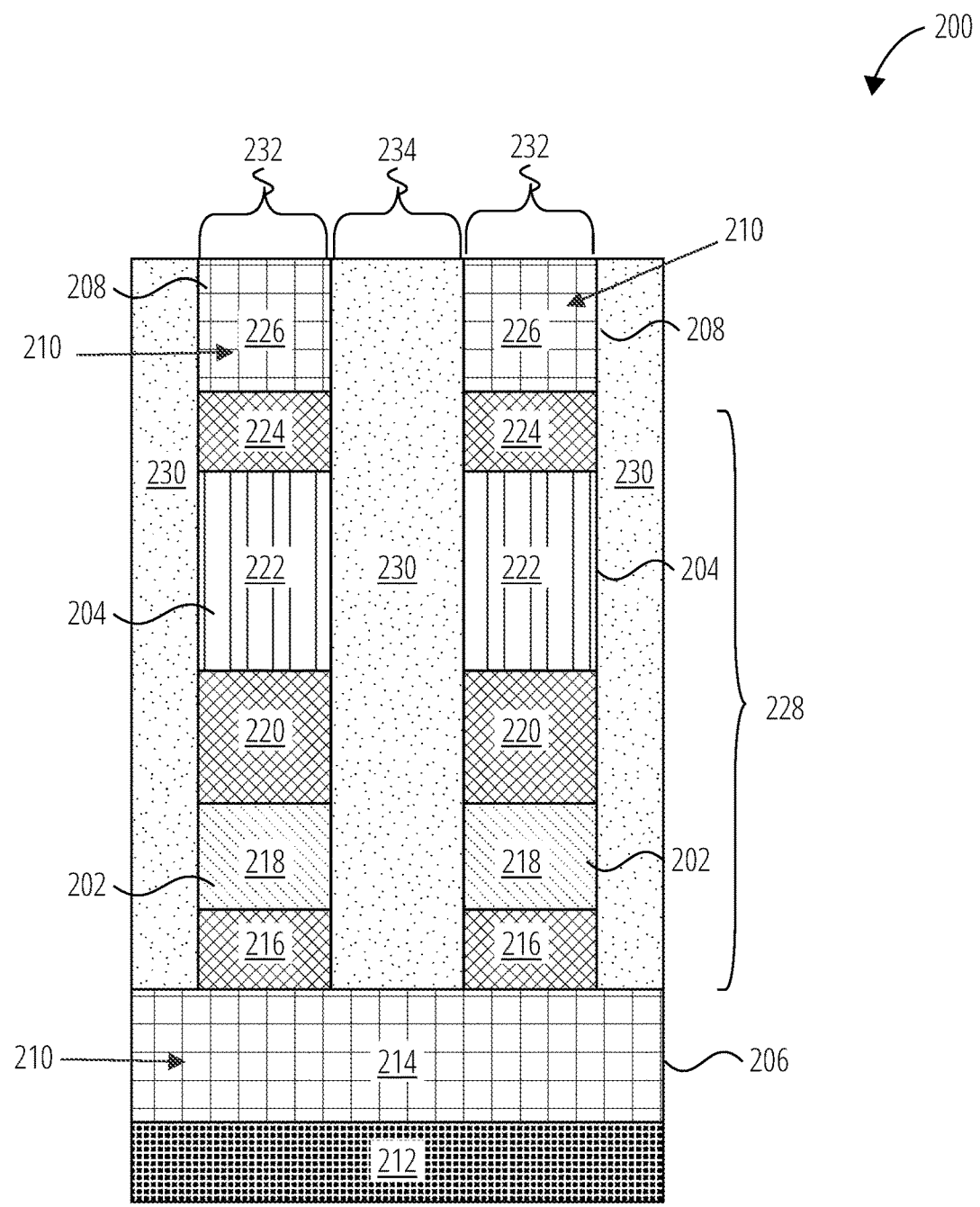
FIG. 2 illustrates a cross-sectional view of a phase change storage cell 200 in accordance with one embodiment.

FIG. 2 illustrates a cross-sectional view of a phase change storage cell 200 in accordance with one embodiment. The phase change storage cell may comprise a selector 202 and a phase change storage cell 204. The selector 202 is coupled to a word line 206 and the phase change storage cell 204 is coupled to a bit line 208. The word line 206, selector 202, phase change storage cell 204, and bit line 208 may be connected in series, in that order. In one embodiment, the bit line 208 and word line 206 may comprise monosilicide electrodes 210 formed through the methods disclosed herein. "Monosilicide electrode" refers to an electrode made from a silicide comprising a single silicon atom per molecule or unit cell. A silicide is a compound of silicon and another element, usually a metal (Search "silicide" and "monosilicide" on yourdictionary.com© 1996-2020 LoveToKnow, Corp. Accessed Apr. 3, 2020.)

The selector 202 permits control of individual memory cells. "Selector" refers to a switch configured to control when a phase change storage cell receives current. In one embodiment, the selector is an ovonic threshold switch (OTS) which is a two-terminal symmetrical voltage sensitive switching device. (Roy R. Shanks, "Ovonic threshold switching characteristics", Journal of Non-Crystalline Solids, Elsevier, Jan. 1970.)

The elements comprising the cross-sectional view of a phase change storage cell 200 may be created by forming layers of different materials on a wafer substrate 212. "Wafer" refers to a very thin slice of a semiconductor crystal used as the substrate for solid-state circuitry. (Search "wafer" on lexico.com© 2020 Lexico.com. Accessed Apr. 3, 2020.) "Substrate" refers to a material which provides a surface on which something is deposited or inscribed, for example the silicon wafer used to manufacture integrated circuits. (Search "substrate" on lexico.com© 2020 Lexico.com. Edited. Accessed Apr. 3, 2020.) In certain embodiments, a substrate may comprise a silicon wafer and in other embodiments, a substrate may comprise another layer of an integrated semiconductor, including, but not limited to, a top surface of a cell film stack, or the like.

A layer of metal monosilicide 214 may be formed to provide a word line 206 monosilicide electrode 210, followed by a layer of carbon 216. In one embodiment, the metal monosilicide 214 may consist of a compound formed by silicon (Si) and a single metal from a metal group consisting of nickel, cobalt, platinum, and vanadium. The carbon 216 layer may serve here, and elsewhere within the layer or cell film stack, to connect the structures formed by other layers in series. Thus, this layer of carbon 216 may act to connect the metal monosilicide 214 word line 206 to the selector 202.

The selector 202 may be formed by depositing a layer of ovonic threshold switch 218 material over the layer of carbon 216. Another layer of carbon 220 may be deposited over the ovonic threshold switch 218 to connect the ovonic threshold switch 218 selector 202 to the phase change storage cell 204. The phase change storage cell 204 may be formed by depositing a layer of Ge—Sb—Te 222, which may be followed by another carbon 224 layer. Next, a second layer of metal monosilicide 226 may be formed and serve as a bit line 208 monosilicide electrode 210. In one embodiment, the monosilicide electrodes 210 of word lines 206 and bit lines 208 of a non-volatile memory array 110 may have a resistance of between 1.2 and 1.7 mega-ohms per centimeter. "Mega-ohms per centimeter" refers to a unit of measure for electrical resistance in electrodes, terminals, control lines, or other very small structures.

In certain embodiments, the cell film stack 228, described above, may span a region larger than that illustrated in FIG. 2, and be continuous in a direction into, or out of the page. FIG. 2 illustrates a cell film stack 228 after formation of trenches 234 and filling of trenches 234 with a dielectric such as silicon oxide, SiO 230. "Cell film stack" refers to a multi-layer stack of two or more thin films configured to function as a storage cell (also referred to as a memory cell). In general, one or more terminals connect, or couple, to corresponding portions of the cell film stack to connect a single storage cell into a larger structure such as a non-volatile memory array which may be configured as a cross-point array.

To form a phase change storage cell, narrow vertical regions or pillars 232, comprising a small portion of each layer, may be formed by removing sections of the cell film stack 228 to create trenches 234 between the pillars 232. In order to maintain electrical isolation between the pillars 232 while implementing desired polarization effects for the operation of the phase change storage cell, the trenches 234 may be filled with a dielectric material such as SiO 230. "Dielectric" refers to an electrical insulator that can be polarized by an applied electric field. When a dielectric material is placed in an electric field, electric charges do not flow through the material as they do in an electrical conductor but slightly shift from their average equilibrium positions causing dielectric polarization. (Search "dielectric" on Wikipedia.com Mar. 8, 2020. Edited. Accessed Apr. 3, 2020.)

"Phase change storage cell" refers to a two terminal storage cell comprising a chalcogenide material configured to provide a detectable electrical resistance when the chalcogenide material is in crystalline state and a distinguishable electrical resistance when the chalcogenide material is in an amorphous state. In certain embodiments, a phase change storage cell may include a heater for changing the state of the chalcogenide material. In another embodiment, electric current passing through the phase change storage cell sufficiently heats the chalcogenide material to cause the phase transition from crystalline to amorphous or vice versa.

In certain embodiments, the chalcogenide material may be a compound of Germanium, Antimony, and Tellurium $Ge_2Sb_2Te_5$ (GST). Those of skill in the art will recognize that other forms of chalcogenide material may be used with a phase change storage cell.

During programming of a phase change storage cell, the temperature in the phase change material (i.e., the GST) may reach a level that affects the material structure. The GST may thereby transition from an amorphous state to a crystalline state. At another temperature, the crystal structure may be disrupted, returning the material to an amorphous state. At or near a threshold voltage, the GST or other phase change material may exhibit switching characteristics. Below this threshold voltage, the GST may exhibit high resistance. Slightly above the threshold voltage, the GST may switch to a low-resistance, conductive state. At this point, a higher current flow may be possible, which may allow the material to reach a higher temperature more quickly. Once the temperature meets a melting threshold, the atoms may disarrange, making the material amorphous again. As the GST is expected to undergo thermal fluctuations, and these fluctuations may induce structural expansion and contraction in surrounding materials, the higher flexibility and ductility of monosilicides when compared to tungsten provides additional advantages to implementing the disclosed solution.

The cell film stack 228 formed on the wafer substrate 212 and comprising carbon 216, ovonic threshold switch 218, and Ge—Sb—Te 222; and the metal monosilicide 214 word line 206, metal monosilicide 226 bit line 208 as well as the pillars 232 and trenches 234, may be formed by a combination of conventional microfabrication techniques and the methods disclosed herein. "Microfabrication" refers to the process of fabricating miniature structures of micrometer scales and smaller. Microfabrication processes may be used for integrated circuit fabrication, also known as "semiconductor manufacturing," "semiconductor processing," "semiconductor process integration," or "semiconductor device fabrication".

A variety of processes for depositing, forming, growing, micro-forming, or adding structures and/or thin films of material to a substrate (e.g., additive material fabrication) and/or patterning, lithography, removing, etching, or dissolving of structures, and/or thin films of material from a substrate (e.g., selective material removal). Examples of such processes include, but are not limited to, deposition, etching, lithography, and the like.

In the last two decades, microelectromechanical systems (MEMS), microsystems (European usage), micromachines (Japanese terminology) and their subfields, microfluidics/lab-on-a-chip, optical MEMS (also called MOEMS), RF MEMS, PowerMEMS, BioMEMS and their extension into nanoscale (for example NEMS, for nano electro mechanical systems) have re-used, adapted or extended microfabrication methods. (Search "microfabrication" on Wikipedia.com Jan. 11, 2020. Edited, Accessed Apr. 3, 2020.) Microfabrication techniques that may be used to implement the disclosed solution are described below.

"Chemical mechanical polishing process" (CMP), also known as "planarization", refers to a process of smoothing surfaces with the combination of chemical and mechanical forces. It can be thought of as a hybrid of chemical etching and free abrasive polishing.

The process uses an abrasive and corrosive chemical slurry (commonly a colloid) in conjunction with a polishing pad and retaining ring, typically of a greater diameter than the wafer. The pad and wafer are pressed together by a dynamic polishing head and held in place by a plastic retaining ring.

The dynamic polishing head is rotated with different axes of rotation (i.e., not concentric). This removes material and tends to even out any irregular topography, making the wafer flat or planar.

CMP polishing and/or leveling may be done to set up the wafer for the formation of additional circuit elements. For example, CMP can bring the entire surface within the depth of field of a photolithography system, or selectively remove material based on its position. Typical depth-of-field requirements are down to Angstrom levels for the latest 22 nm technology. (Search "chemical mechanical polishing" on Wikipedia.com Oct. 21, 2020. Edited. Accessed Mar. 25, 2020.) "Dielectric chemical mechanical polishing process" refers to a chemical mechanical polishing process adapted for removal and or polishing of layers of a dielectric. "Nickel monosilicide chemical mechanical polishing process" refers to a chemical mechanical polishing process adapted for removal and or polishing of layers of nickel monosilicide.

"Deposition" refers to a phase transition in which gas transforms into solid without passing through the liquid phase. Deposition is a thermodynamic process. The reverse of deposition is sublimation and hence sometimes deposition is called desublimation. (Search "deposition" on Wikipedia.com Mar. 3, 2020. Accessed Apr. 3, 2020.)

Deposition is one of many processes that may be used in microfabrication of an integrated semiconductor device or structure. Principles and mechanics of deposition are used in the manufacture or generation of thin film layers and/or structures and are referred to as thin film deposition. "Thin film deposition" refers to any technique for depositing a thin film of material onto a substrate or onto previously deposited layers. (Search "thin film" on Wikipedia.com Apr. 1, 2020. Accessed Apr. 3, 2020.) Examples of different types of thin film deposition include, but are not limited to, chemical deposition, physical deposition, epitaxy, and the like.

Examples of chemical deposition include chemical solution deposition (CSD) or chemical bath deposition (CBD), spin coating or spin casting, dip coating, chemical vapor deposition (CVD), plasma enhanced CVD (PECVD), atomic layer deposition (ALD), molecular vapor deposition (MLD), and the like. Examples of physical deposition include a thermal evaporator, molecular beam epitaxy (MBE), an electron beam evaporator, sputtering, pulsed laser deposition, cathodic arc deposition, electrohydrodynamic deposition, and the like. Embodiments claimed and described herein may use one or more current or future thin film deposition techniques to implement one or more of the process steps disclosed.

"Thin film" refers to a layer of material ranging from fractions of a nanometer (monolayer) to several micrometers in thickness. The controlled synthesis of materials as thin films (a process referred to as deposition) is a fundamental step in many applications such as the manufacture of patterned storage media, magnetic recording media, electronic semiconductor devices, Light Emitting Diodes LEDs, storage cells, and the like. (Search "thin film" on Wikipedia.com Apr. 1, 2020. Accessed Apr. 3, 2020.) "Thickness" refers to a dimension for a structure (e.g. Integrated Circuit Semiconductor (ICS)), material layer, and/or thin film formed by way of a microfabrication process. As used herein, thickness refers to a measurement from a bottom of an ISC or thin film to a top of the ISC or thin film where the bottom and top run parallel to an X-axis of an X-Y coordinate axis and the thickness is measured parallel to the Y-axis.

"Etching" refers to one of many processes that may be used in microfabrication of an integrated semiconductor device or structure. Often, etching is used to selectively remove one material while leaving other materials mainly unchanged. In one embodiment, etching is used to chemically remove layers, such as a thin film, from a surface of a wafer during manufacturing. (Search "etching (microfabrication)" on Wikipedia.com Sep. 23, 2019. Edited, Accessed Apr. 3, 2020.)

Examples of etching include wet etching, dry etching, reactive ion etching, and plasma etching. Those of skill in the art will recognize these types of etching and how these types and future developed types may be used in connection with the disclosed solutions.

"Thermal solid-state reaction" refers to reactions performed in the absence of solvents by either grinding or melting the starting materials together or simply applying heat to a mixture of starting materials. This type of reaction is usually performed in order to obtain polycrystalline inorganic solids but may also be used in organic synthesis. Solid state reactions offer reduced costs, decreased amounts of chemical waste and, sometimes, an increase in yield. (See LaboChema website labochema.com search solid-state reaction. Last visited Apr. 3, 2020)

FIGS. 3A-D and FIG. 3 provide process cross-sectional wafer views 300 and process cross-sectional wafer views 400, respectively. Process cross-sectional wafer views 300 and process cross-sectional wafer views 400 illustrate steps that may be used in a manufacturing method, such as steps in microfabrication, to form a monosilicide electrode in accordance with one embodiment.

Figure 3A:
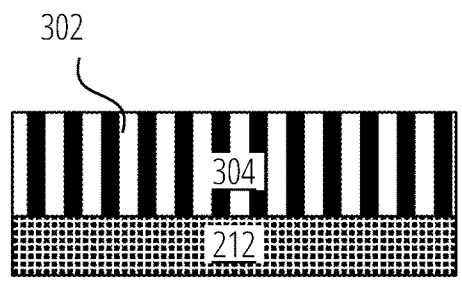
FIGS. 3A-D illustrate process cross-sectional wafer views 300 in accordance with one embodiment.

FIG. 3A illustrates a process state after word line 302 formation. A NiSi 304 layer can be formed directly on the wafer substrate 212. Those of skill in the art will recognize that this NiSi 304 layer may be formed using one, or more, of the methods used for the bit line layer formation, as described below and claimed herein, so the description of word line 302 formation is omitted here for conciseness.

Figure 3B:
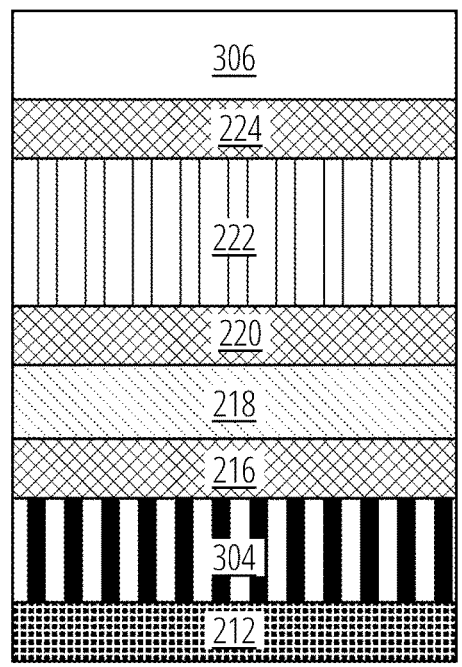

FIG. 3B illustrates a process state in which a cell film stack 228 is formed above the word line 302 (also referred to as a word line layer). From the bottom up, the layers in place include the wafer substrate 212, the NiSi 304 word line, carbon 216, ovonic threshold switch 218, carbon 220, Ge—Sb—Te 222, carbon 224, and top silicon layer (Si 306). "Top silicon layer" refers to a layer of silicon on top of a substrate, cell film stack, wafer, or the like. "Silicon layer" refers to a thin film layer of silicon. The cell film stack 228 is formed using similar microfabrication methods described in relation to FIG. 2. The Si 306 may be sputter deposited on to the carbon 224.

Figure 3C:
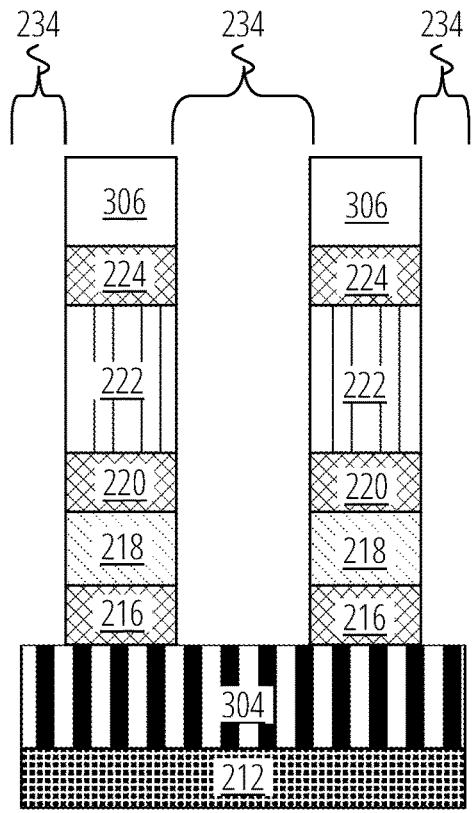

FIG. 3C illustrates a process state after etching. The cell film stack 228 may be etched to form a plurality of pillars separated by trenches. Conventional etching techniques may be used to form the plurality of pillars and the associated trenches 234.

Figure 3D:
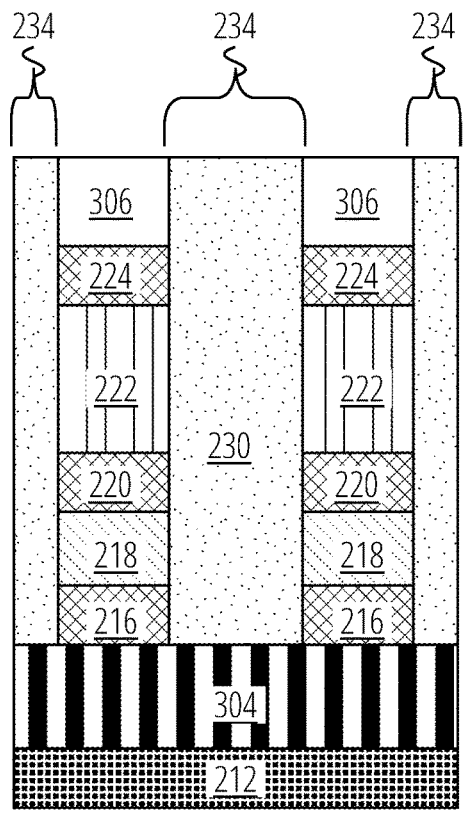

FIG. 3D illustrates a process state after filling the trenches 234 with a dielectric, such as SiO 230. The dielectric may be deposited using convention deposition techniques to fill in the gaps (trenches) between the plurality of pillars. In one embodiment, the wafer may be planarized to expose the top silicon layer after dielectric deposition, and/or to remove protrusions of either dielectric or silicon, in order to form a smooth surface. In this manner, the Si 306 layer may become an exposed top silicon layer. "Exposed top silicon layer" refers to a top silicon layer that has been covered or coated in a prior process step or is currently covered or coated and is subsequently exposed by one or more of etching, selective material removal process, chemical mechanical polishing process, a mechanical polishing process, and/or the like. Each pillar may include an exposed top silicon layer.

Conventional chemical mechanical polishing processes may be used to planarize the wafer. "Protrusion" refers to a structure or portion of a structure that protrudes or extends from one other structure. Generally, the other structure is connected to the protrusion. A smooth surface may be desirable before the process continues in order to provide adequate contact between the exposed top silicon layer and subsequent layers, described below.

Figure 4A:
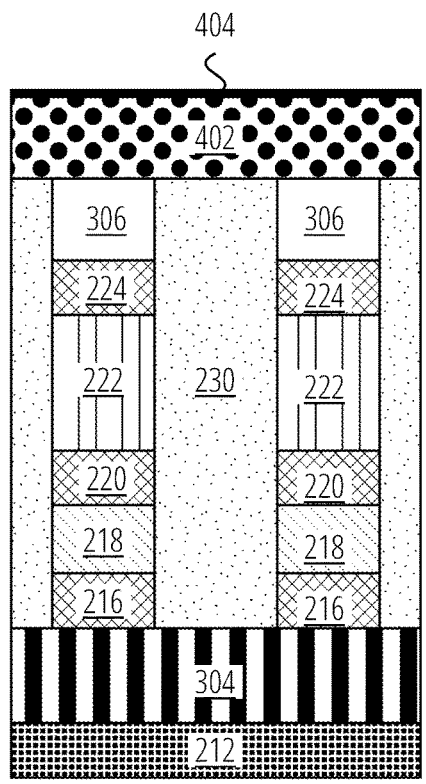
FIGS. 4A-D illustrate further process cross-sectional wafer views 300 in accordance with the embodiment of FIGS. 3A-D.

FIG. 4A illustrates a process state after nickel deposition. A thin nickel layer (Ni 402) can be deposited on to the exposed top silicon layer. "Nickel layer" refers to a thin film of nickel. In one embodiment, the nickel layer covers the exposed top silicon layer and is deposited to a predefined thickness.

In certain embodiments, a thin titanium nitride layer (TiN 404) can be deposited on the nickel layer. The titanium nitride layer 404 may have a thickness of between about 10 nanometers and about 20 nanometers. The titanium nitride layer 404 may serve to prevent oxidation of the nickel with oxygen the wafer may be exposed to during a fabrication process. Surface oxidation of the nickel is undesirable because such oxidation may disturb the thermal solid-state reaction of nickel layer (Ni 402) and the silicon layer (Si 306) during the silicidation (e.g., annealing).

In one embodiment, the nickel layer may be about 0.452 times the thickness of a desired thickness of the nickel monosilicide layer, and the exposed top silicon layer may be about 0.828 times a thickness of a desired thickness of a nickel monosilicide layer that will form a monosilicide electrode. More details relating to the relative thicknesses of the nickel layer, silicon layer, and nickel monosilicide are described in greater detail with regard to FIGS. 8A-D.

"Nickel monosilicide layer" refers to a thin film of nickel monosilicide. "Nickel monosilicide" refers to a monosilicide that includes a single nickel atom per molecule or unit cell of silicon. Nickel monosilicide is represented by the symbol NiSi.

Figure 4B:
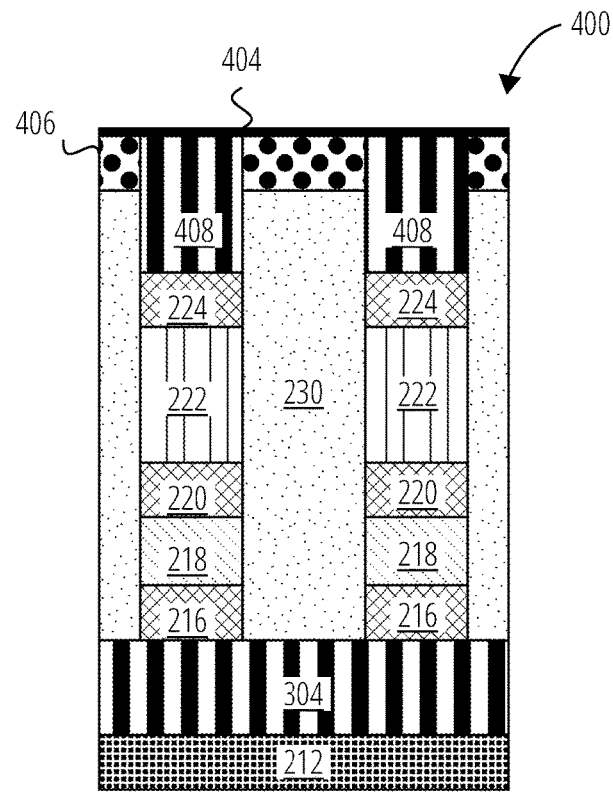

FIG. 4B illustrates a process state after silicidation. During silicidation, the exposed top silicon layer and the nickel layer are annealed, or heated, to about 350° C. such that the nickel layer reacts through a thermal solid-state reaction with the exposed top silicon layer to form a nickel monosilicide layer (nickel monosilicide 408). "Thermal solid-state reaction" refers to reactions performed in the absence of solvents by either grinding or melting the starting materials together or simply applying heat to a mixture of starting materials. This type of reaction is usually performed in order to obtain polycrystalline inorganic solids but may also be used in organic synthesis. Solid state reactions offer reduced costs, decreased amounts of chemical waste and, sometimes, an increase in yield. (See LaboChema website labochema.com search solid-state reaction. Last visited Apr. 3, 2020). In certain embodiments, annealing the exposed top silicon layer and the nickel layer may convert at least a portion of the exposed top silicon layer into nickel monosilicide.

In certain embodiments, the exposed top silicon layer and the nickel layer are annealed for a predefined time period. The time period may vary depending on the thickness of the nickel layer, the desired thickness for the final nickel monosilicide, and the nickel diffusivity [$nm^2/s$]. Those of skill in the art recognize and understand how to account for these variables to set a predefined time period for the silicidation. In one embodiment, the predefined time period for silicidation of the exposed top silicon layer, Si 306, and the nickel layer, Ni 402 is between about 2 and about 8 minutes. In another embodiment, the predefined time period for this silicidation is between about 4 and about 6 minutes. In other embodiments, the predefined time period for this silicidation may be several hours.

A layer of unreacted nickel 406 may remain after silicidation. "Layer of unreacted nickel" refers to a thin film of nickel that did not diffuse or react with adjacent materials during a thermal reaction process. In certain embodiments, the layer of unreacted nickel 406 may be concentrated in areas furthest away from the pillars. As shown, the nickel monosilicide 408 (NiSi) layer may substantially replace the exposed top silicon layer (Si 306).

Figure 4C:
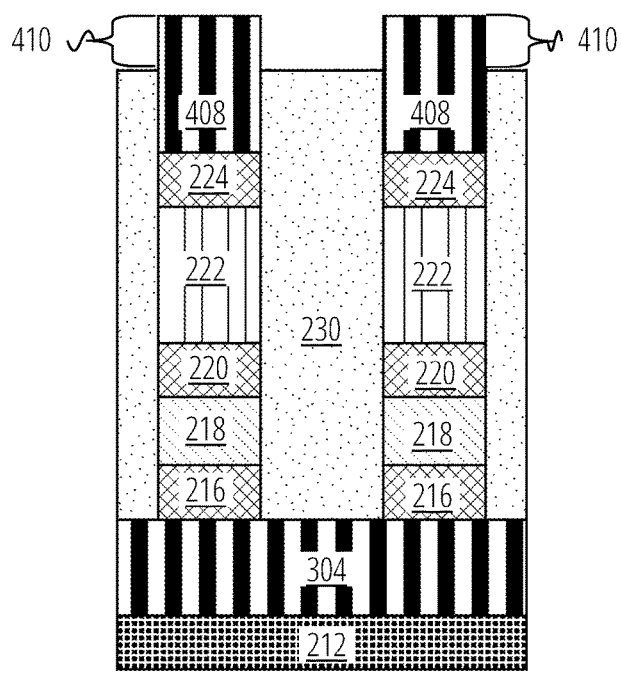

FIG. 4C illustrates a process state after nickel removal. In one embodiment, the layer of unreacted nickel 406 remaining in FIG. 4B may be removed by wet etching using a mixture of sulfuric acid and hydrogen peroxide. In embodiments with a titanium nitride layer 404, the wet etching may also be used to remove the titanium nitride layer 404. At this stage in the process illustrated in FIGS. 3a-d and FIGS. 4a-d, the exposed top silicon layer is converted into nickel monosilicide and the nickel monosilicide layer serves as a monosilicide electrode.

In some embodiments, such as the one illustrated, silicidation and removal of remaining unreacted nickel may result in a protrusion 410 of the nickel monosilicide 408 layer above the surface of the wafer. These protrusions 410 may necessitate planarization. In other embodiments, planarization may not be needed at this stage in the process.

Figure 4D:
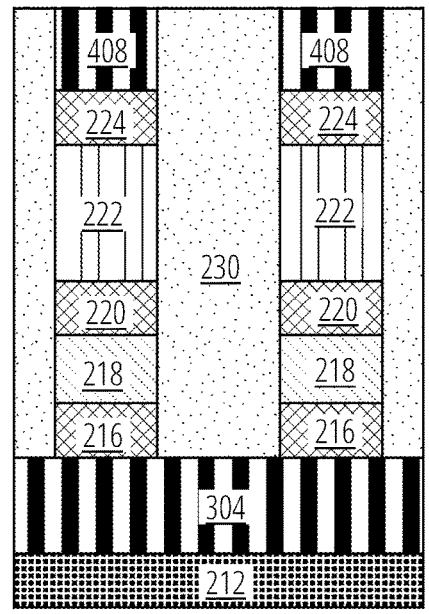

FIG. 4D illustrates a process state after planarization. The planarization removes the protrusions 410, leaving a smooth wafer surface. In one embodiment, planarization comprises applying a nickel mono-silicide chemical mechanical polishing process to the wafer. In another embodiment, planarization comprises depositing a dielectric film onto the nickel monosilicide layer, applying a dielectric chemical mechanical polishing process to the wafer, then planarizing the wafer to remove the remaining protrusion "Dielectric film" refers to a thin film of a dielectric.

FIGS. 3A-D and FIGS. 4A-D illustrated multiple views of a wafer throughout a process of forming a monosilicide electrode for an integrated semiconductor. The process steps provide a mechanism for forming a durable, thin, low resistance monosilicide electrode of a nickel monosilicide. In certain embodiments, the nickel monosilicide serves as a bit line, in other embodiments the nickel monosilicide may serve as a word line or other control line for a non-volatile memory array. In one embodiments of a method of forming a monosilicide electrode, an exposed top silicon layer is converted into a nickel monosilicide layer. In such an embodiment, the nickel monosilicide layer substantially replaces the exposed top silicon layer. In other embodiments, the nickel monosilicide layer may permeate most of the exposed top silicon layer and still leave some residual silicon between the nickel monosilicide and the exposed top silicon layer (described below in relation to FIG. 7).

FIGS. 5A-D and FIGS. 6A-D provide process cross-sectional views 500 and process cross-sectional views 600, respectively for a process in accordance with a single embodiment. These process cross-sectional views 500 and process cross-sectional views 600 illustrate steps (material at different stages) that may be used to form a monosilicide electrode in accordance with one embodiment. In this embodiment, two annealing steps may be performed, and a final planarization step may not be needed in the process. A final planarization step may be avoided by calculating thickness of the silicon layer and nickel layer (or other metal used for silicidation) such that the resulting nickel monosilicide layer is at a desired level and/or thickness. This is possible by leveraging a Gibbs' free energy change in the chemical reaction (thermal solid-state reaction) between the silicon layer and the nickel layer over the two step annealing formation process.

Gibbs free energy is a thermodynamic quantity that may be used to determine how one material will react with another during a thermal solid-state reaction under a constant temperature and pressure. In certain embodiments, a Gibbs free energy quantity is used to ensure that silicidation of nickel and silicon proceeds to a desired state (formation of di-nickel silicide ($Ni_2Si$)) and not an undesired state (formation of NiSi during a first of two annealing steps/stages). In the first annealing of a process described in relation to FIGS. 5A-D and FIGS. 6A-D, a di-nickel silicide ($Ni_2Si$) layer is formed by a thermal solid-state reaction between Si and Ni at about 260° C. "Di-nickel silicide layer" refers to a thin film of di-nickel silicide represented by the symbol $Ni_2Si$.

When forming nickel monosilicide from a nickel layer and a silicon layer, it is desirable to form NiSi to serve as the monosilicide electrode and not di-nickel silicide ($Ni_2Si$) because di-nickel silicide has higher resistance than NiSi. In an embodiment for forming nickel monosilicide using two annealing steps, the predefined thickness of the material, predefined time period, and temperature for the annealing are controlled to form di-nickel silicide ($Ni_2Si$) in the first annealing step and not permit the di-nickel silicide ($Ni_2Si$) to further react to form nickel monosilicide (NiSi) at this stage. In addition to controlling the temperature for a first annealing, the pressure, the time of exposure; the thickness of the nickel may be thick enough that unreacted nickel remains after the first annealing. Based on the Gibbs free energy change quantities for the reaction of 2Ni and Si to form Ni2Si, a dominant product of this first silicidation phase (first annealing) is di-nickel silicide and a layer of unreacted nickel. This is because the Gibbs' free energy change of $Ni_2Si$ formation is smaller than that of NiSi, as shown in Table 1.

Accordingly, in one embodiment, the thickness of the Ni metal is controlled such that the Ni metal is fully consumed at the first annealing, or some unreacted nickel remains on the $Ni_2Si$ after the first annealing. Having a layer of unreacted nickel is desirable.

TABLE 1

Gibbs' free energy change (250-450° C.)

| Reaction | $\Delta G°$ kJ/mol |
| --- | --- |
| $2Ni + Si \rightarrow Ni_2Si$ | −136 to −135 |
| $Ni + Si \rightarrow NiSi$ | −88 |
| $½Ni_2Si + ½Si \rightarrow NiSi$ | −46 |

Figure 5A:
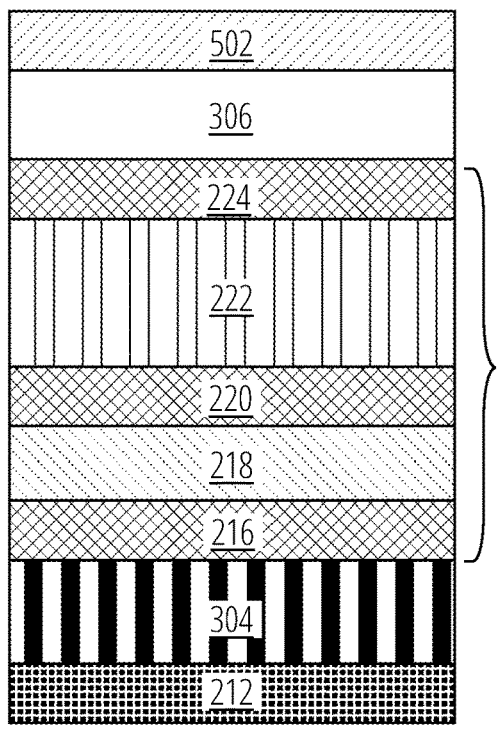
FIGS. 5A-D illustrate process cross-sectional views 500 in accordance with one embodiment.

FIG. 5A illustrates a process state after cell film stack 228 is deposited using a plurality of steps, as described in relation to FIG. 2. The cell film stack 228 may be deposited on a wafer substrate 212, and may include a NiSi 304 layer that serves as a word line 206, a carbon 216 layer, an ovonic threshold switch 218 layer, a carbon 220 layer, a Ge—Sb—Te 222 layer, a carbon 224 layer, and a Si 306 layer that is a top silicon layer, as shown. A sacrificial layer 502 can be deposited onto the Si 306 layer. "Sacrificial layer" refers to a layer of material, typically a thin film, used in microfabrication to temporarily create one or more structures for certain steps of a microfabrication process. In certain embodiments, the sacrificial layer is temporary because once the microfabrication process completes the sacrificial layer has been removed or rendered inactive with respect to structures and/or devices formed in in a microfabrication process. In one embodiment, the sacrificial layer 502 is an amorphous carbon.

Figure 5B:
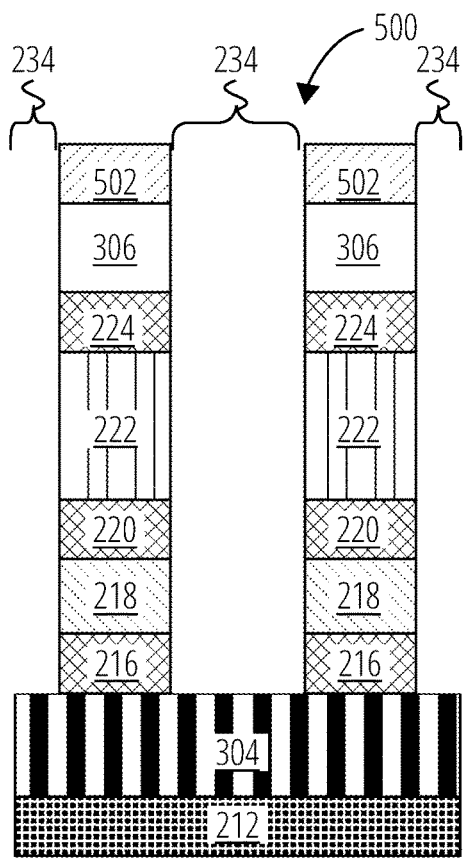
Figure 5C:
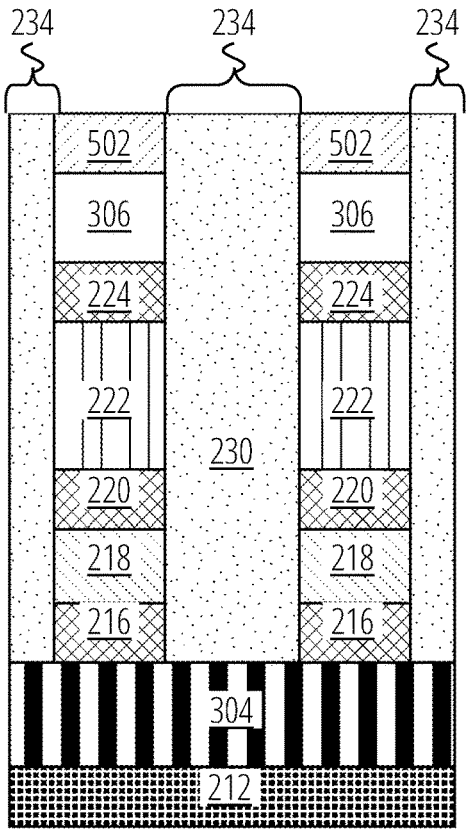

FIG. 5B illustrates a process state after etching of trenches 234. The cell film stack and sacrificial layer 502 may be etched to form a plurality of pillars, as previously described with regard to FIG. 3C. FIG. 5C illustrates a process state after deposition of a dielectric fill, such as SiO 230, which may be performed as described with regard to FIG. 3D. FIG. 5C illustrates that, in one embodiment, the dielectric fill is deposited up to the same level as the sacrificial layer 502.

Figure 5D:
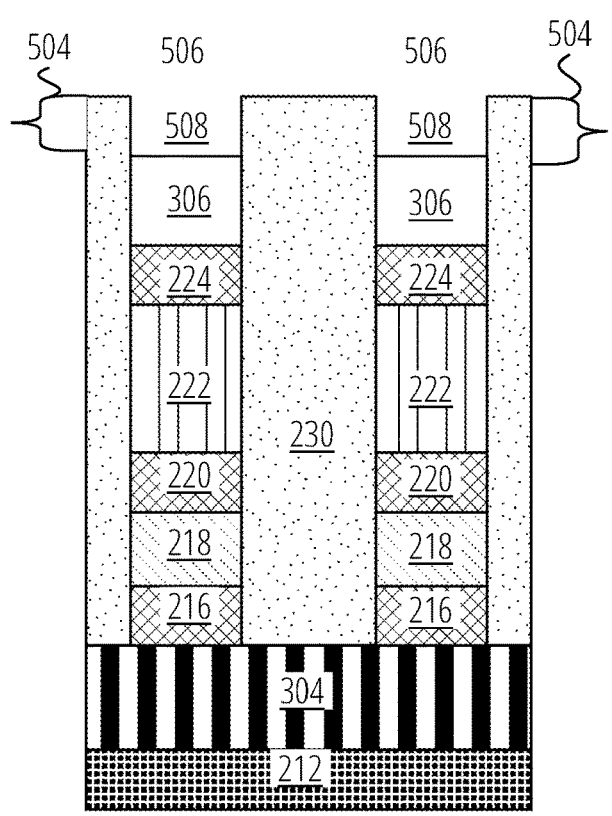

FIG. 5D illustrates a process state after removal of the sacrificial layer. In some embodiments, a portion of the sacrificial layer 502 may be removed along with surrounding dielectric through planarization, in order to achieve a desired thickness of a remaining sacrificial layer 502. The planarization step that reduces the thickness of the sacrificial layer 502 to a desired remaining thickness also planarizes the dielectric fill, SiO 230.

The sacrificial layer 502 on top of each pillar can be removed through etching, leaving a portion of the dielectric protruding (dielectric protrusion 504) and forming at least two walls 506 that extend above each pillar. In certain embodiments, the dielectric and sacrificial layer 502 may not be planarized. Instead, the height/thickness of the dielectric protrusions 504 may be configured/designed to provide a desired sizing of a remaining gap 508 once the sacrificial layer 502 is removed.

FIG. 6A illustrates a process state after nickel deposition. Ni 402 may be deposited onto the wafer to form a nickel layer 604. This nickel layer 604 may cover the dielectric protrusions 504 and the Si 306 surface, top silicon layer, as shown, leaving dips where the nickel layer rests directly on the top silicon layer, within the gaps 508.

In certain embodiments, a thin titanium nitride layer (TiN 404) can be deposited on the nickel layer. The titanium nitride layer 404 may have a thickness of between about 10 nanometers and about 20 nanometers. The titanium nitride layer 404 may serve to prevent oxidation of the nickel with oxygen the wafer may be exposed to during a fabrication process. Surface oxidation of the nickel is undesirable because such oxidation may disturb the thermal solid-state reaction of nickel layer (Ni 402) and the silicon layer (Si 306) during the silicidation (e.g., annealing).

FIG. 6B illustrates a process state after a first silicidation step, a first annealing. This annealing step may be performed by raising the temperature of the wafer to 260° C. for a predefined time period such that nickel in the nickel layer 604 combines with the silicon layer, Si 306, to form a di-nickel silicide layer ($Ni_2Si$ 602). The predefined thickness for the nickel layer 604 and temperature and predefined time period are configured such that the di-nickel silicide layer ($Ni_2Si$ 602) reaches a predefined thickness, leaving a desired portion/thickness of the top silicon layer (Si 306), as well as a layer of unreacted nickel 406.

FIG. 6C illustrates a process state after nickel removal. The layer of unreacted nickel 406 may be removed through wet etching. In embodiments with a titanium nitride layer 404, the wet etching may also be used to remove the titanium nitride layer 404. As a result, the $Ni_2Si$ 602 layer may be exposed for the next step of the process.

FIG. 6D illustrates a process state after a second silicidation, second annealing step. This second silicidation step may be performed by raising the temperature to about 350° C. for a predefined time period. At this temperature, based on the Gibbs' free energy change of the silicidation reaction, and in the absence of additional free, unreacted nickel, the di-nickel silicide layer ($Ni_2Si$ 602) and the remaining silicon (Si 306) may react to form a layer of nickel monosilicide 408 at the top of each pillar, creating a monosilicide electrode.

Because molecules of the $Ni_2Si$ 602 and nickel monosilicide 408 coalesce into configurations with consistent dimensions, the ratios of Ni and Si deposited, the temperatures at which annealing is performed, and the length of time during which silicidation is allowed to occur may be closely controlled to form a nickel monosilicide 408 layer that grows in thickness to become even with the wafer surface (even with dielectric, 230), and requiring no additional planarization, as shown. This is described more with respect to FIGS. 8A-D. In certain embodiments, whether a single annealing step is used, or more than one annealing step is used, the thermal solid-state reaction forms a nickel monosilicide in place of a silicon layer.

In certain embodiments, the ratios of Ni 402 and Si 306 deposited, the temperatures at which a second annealing is performed, and the length of time during which silicidation is allowed to occur may be closely controlled to form a nickel monosilicide 408 layer and not form a nickel di-silicide (NiSi2) layer. Nickel di-silicide (NiSi2) has a much larger resistance than nickel monosilicide or di-nickel silicide. The resistance for nickel di-silicide, NiSi2, is about 50 μΩcm, while the resistance for di-nickel silicide, $Ni_2Si$, is about 25 μΩcm, and the resistance for nickel monosilicide, NiSi, is about 15 μΩcm. Thus, embodiments of the claimed processes and structures are configured to avoid forming nickel di-silicide, NiSi2 by forming exclusively di-nickel silicide, $Ni_2Si$, during the first annealing, by for example ensuring that a layer of unreacted nickel 406 remains after the first annealing, leveraging the Gibbs free energy change quantity differences for the reactions.

Figure 7:
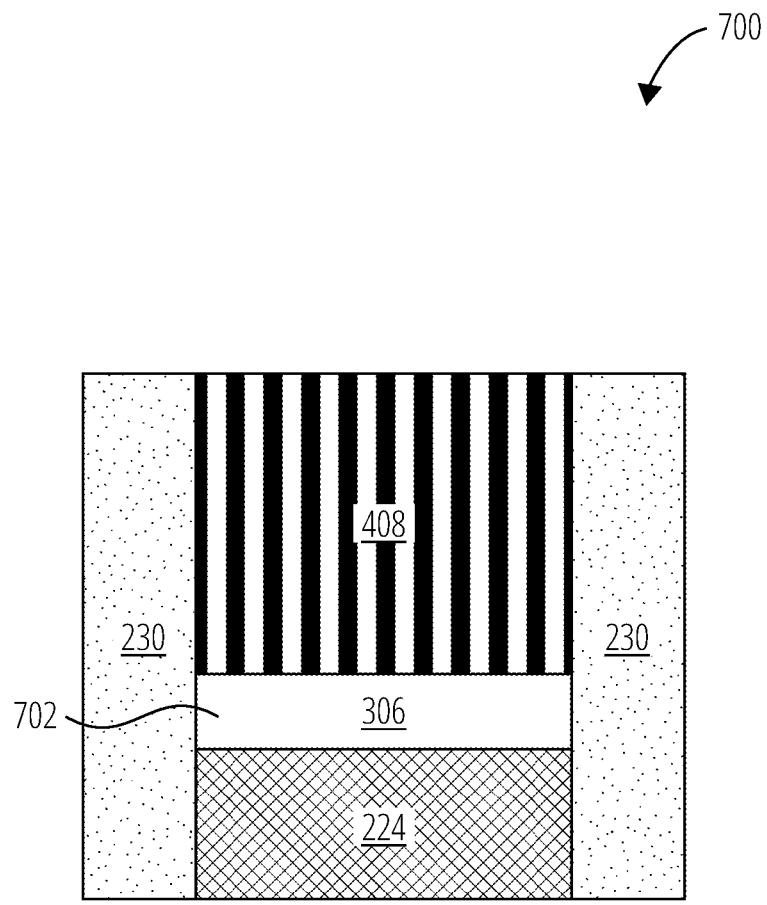
FIG. 7 illustrates a cross-sectional view of a low resistance monosilicide electrode 700 in accordance with one embodiment.

FIG. 7 illustrates a cross-sectional view of a low resistance monosilicide electrode 700 in accordance with one embodiment. FIG. 7 illustrates a stage of forming a monosilicide electrode at, or near the stage illustrated in FIG. 6D. At this stage of the formation process, $Ni_2Si$ 602 reacts with portions of Si 306, a silicon layer, to form a nickel monosilicide 408 layer. Certain embodiments of the claimed solution may be adapted to control the reaction of $Ni_2Si$ 602 and silicon, Si 306, to avoid excess annealing. Excess annealing may be problematic if the annealing leads to agglomeration of grains within the nickel monosilicide 408. Agglomeration of grains within a nickel monosilicide 408 layer may increase resistance within a final monosilicide electrode. Embodiments of the claimed solution may avoid or mitigate grain agglomeration by configuring layer thicknesses, temperatures, and predefined time periods so as to form a residual silicon layer 702 between the nickel monosilicide layer and the topmost layer, such as carbon 224. By leaving the residual silicon layer 702, the thermal solid-state reaction has more silicon to use in the reaction and this may help mitigate, or prevent, agglomeration, particularly as agglomeration may be a result of excess annealing.

FIG. 7 illustrates layers of carbon 224, Si 306, and nickel monosilicide 408 between dielectric (SiO 230). In certain embodiments, a monosilicide electrode formation process includes forming (or leaving) a residual silicon layer 702 after silicidation between the layer positioned below the silicon layer, such as carbon 224, and the nickel monosilicide 408 layer (e.g., monosilicide electrode). "Residual silicon layer" refers to an amount of silicon film, remaining after a selective material removal process and/or a silicidation process. A residual silicon layer 702 of a predefined thickness may be permissible to control agglomeration that may result from excessive annealing in a second annealing step.

In order to form the monosilicide electrode and other layers of an operable cell film stack, including any residual silicon layers, the thicknesses of the layers may be carefully designed, managed, and controlled. In one embodiment, such as that described in relation to FIGS. 5A-D and FIGS. 6A-D, the top silicon layer, Si 306, may be greater than 0.828 times the thickness of the desired finished nickel monosilicide layer, nickel monosilicide 408. As a result, annealing the wafer at 350° C. for a predefined time period to form the nickel monosilicide 408 layer causes the di-nickel silicide layer to completely react to form the nickel monosilicide 408 without consuming all of the top silicon layer, Si 306, leaving a residual silicon layer 702 beneath the nickel monosilicide 408 layer.

In another embodiment, a single annealing process may be configured with a predefined time period and a rate of temperature increase designed to mitigate agglomeration of the nickel monosilicide layer, leaving the residual silicon layer 702.

FIGS. 8A-D illustrate thickness ratios for thin film layers for forming a low resistance monosilicide electrode 800. These ratios may allow silicidation through double annealing as described with regard to FIGS. 5A-D and FIGS. 6A-D to result in an even wafer surface with no need for planarization. This is possible based on the ratios described in Table 2 below.

TABLE 2

Thickness relation of elements and silicides

| Phase | Density (Mg/m³) | R1 | R2 |
|---|---|---|---|
| Ni | 8.91 | — | — |
| Ni₂Si | 7.27 | 1.52 | 0.915 |
| NiSi | 5.95 | 2.21 | 1.83 |
| Si | 2.33 | — | — |

R1: Ratio of silicide thickness to deposited nickel metal film thickness.

R2: Ratio of reacted silicon thickness to deposited nickel metal film thickness.

In this embodiment, a final layer of nickel monosilicide 408 having a certain thickness is desired. That thickness may be expressed as a unit measure, or "1", for the purpose of determining the relative thicknesses that may be needed for the silicon layer and the nickel layer.

Figure 8A:
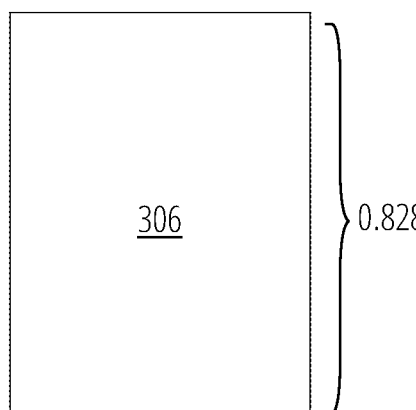
FIGS. 8A-D illustrate thickness ratios for thin film layers for forming a low resistance monosilicide electrode 800 in accordance with one embodiment.

In FIG. 8A, a layer of nickel monosilicide 408 may be deposited that is 0.828 times the desired final NiSi thickness of 1. Based on the R2 value for NiSi in Table 2, the thickness of the Ni 402 layer needed may be determined through Equations 1 through 3.

$$\frac{\text{Si thickness}}{\text{Ni thickness}} = R2 \text{ for NiSi} = 1.83 \quad \text{Equation 1}$$

$$\text{Ni thickness} = \frac{\text{Si thickness}}{1.83} = \frac{0.828}{1.83} \quad \text{Equation 2}$$

$$\text{Ni thickness} = 0.452 \quad \text{Equation 3}$$

Figure 8B:
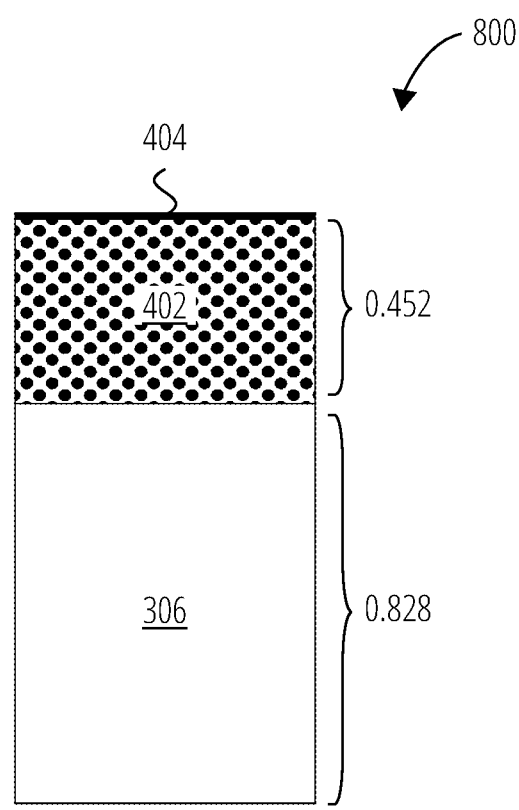

Thus, in FIG. 8B, a nickel layer (Ni 402) of thickness 0.452 may be deposited. The total thickness of the deposited layers may therefore be 1.28 times the desired finished thickness of the nickel monosilicide 408 layer.

Figure 8C:
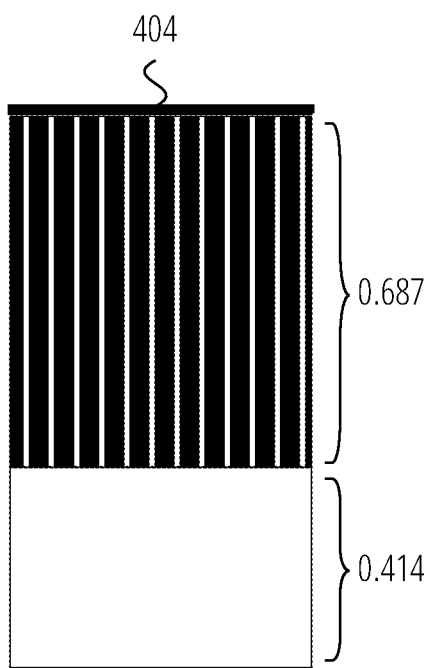

FIG. 8C illustrates a process state after a first annealing at around 260° C. This annealing may be performed for a predefined time period calculated to allow substantially all of the nickel to be consumed into the reaction, forming the Ni₂Si 602 layer. The ratios in Table 2 for Ni₂Si may be used to determine the thickness of the resulting Ni₂Si 602 layer using Equations 4 through 6.

$$\frac{\text{Ni}_2\text{Si thickness}}{\text{Ni thickness}} = R1 \text{ for Ni}_2\text{Si} = 1.52 \quad \text{Equation 4}$$

$$\text{Ni}_2\text{Si thickness} = 1.52 \times \text{Ni thickness} = 1.52 \times 0.452 \quad \text{Equation 5}$$

$$\text{Ni}_2\text{Si thickness} = 0.687 \quad \text{Equation 6}$$

Similarly, the silicon layer thickness for the second annealing may be determined through Equations 7 through 9.

$$\frac{\text{Si thickness}}{\text{Ni thickness}} = R2 \text{ for Ni}_2\text{Si} = 0.915 \quad \text{Equation 7}$$

$$\text{Si thickness} = 0.915 \times \text{Ni thickness} = 0.915 \times 0.452 \quad \text{Equation 8}$$

$$\text{Si thickness} = 0.414 \quad \text{Equation 9}$$

Figure 8D:
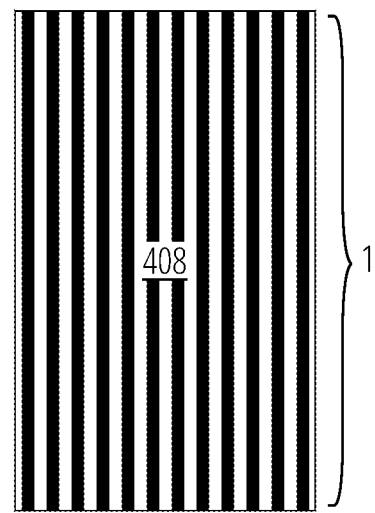

Note that the Si thickness resulting in Equation 9 is the thickness that is to be consumed by the reaction in the second annealing. FIG. 8D illustrates a finished process state after a second annealing at about 350° C. This annealing may be performed for a predefined time period calculated to allow substantially all of the remaining silicon to be consumed into the reaction, forming a nickel monosilicide 408 layer. That the thickness of this final layer is about "1" as desired may be shown through Equations 10 through 12.

$$\frac{\text{NiSi thickness}}{\text{Ni thickness}} = R1 \text{ for NiSi} = 2.21 \quad \text{Equation 10}$$

-continued $$\text{NiSi thickness} = 2.21 \times \text{Ni thickness} = 2.21 \times 0.452 \quad \text{Equation 11}$$

$$\text{NiSi thickness} = 1 \quad \text{Equation 12}$$

(Some rounding error may be incurred when calculating with decimals rounded as presented above. More exact calculations may be performed to come within acceptable tolerances of layer thicknesses.)

FIGS. 9A-B illustrate cross-sectional views of a low resistance monosilicide electrode 900 in accordance with one embodiment. FIG. 9A shows an axial cross section of a monosilicide electrode running between two columns of SiO 902 and above a carbon layer, such as carbon 224, in the direction of the Z axis illustrated. FIG. 9B shows a lengthwise cross-section of the same monosilicide electrode.

The annealing process(es) forming the nickel monosilicide 408 electrode may be configured such that the NiSi molecules aggregate into grains or crystallites. "Crystallite" refers to a small or even microscopic crystal which forms, for example, during the cooling of many materials. The orientation of crystallites can be random with no preferred direction, called random texture, or directed, possibly due to growth and processing conditions. Fiber texture is an example of the latter. Crystallites are also referred to as grains. (Search "crystallite" on Wikipedia.com Feb. 14, 2020. Accessed Apr. 3, 2020.) These grains may have a mean grain size large enough that the entire cross-sectional area shown is taken up with a single grain having a single grain boundary 904. Single grain boundary "Single grain boundary" refers to an interface between two grains, or crystallites, in a polycrystalline material. Grain boundaries are 2D defects in the crystal structure and tend to decrease the electrical and thermal conductivity of the material. (Search "grain boundary" on Wikipedia.com Nov. 30, 2019. Accessed Apr. 3, 2020.) In one embodiment, the mean grain size 906 (e.g., length) may between 50 and 100 nanometers and the electrode thickness 908 may comprise a single grain and average width 910 is between about 10 and about 20 nanometers.

A large mean grain size such as that illustrated may improve conductivity of a material matrix that includes the monosilicide electrode. Electrons passing through a conductor at high speeds may experience reflection and interference effects at grain boundaries within a material matrix. Each such encounter may dissipate a small amount of signal energy, causing power loss and slowing signal transmission. As shown in FIG. 9B, a current flow 912 in the direction of the Z axis, along the length of the electrode, would need to traverse no more than five grains. A smaller mean grain size may increase that number, and this increase may contribute to additional signal loss along the length of the conductor.

Figure 10:
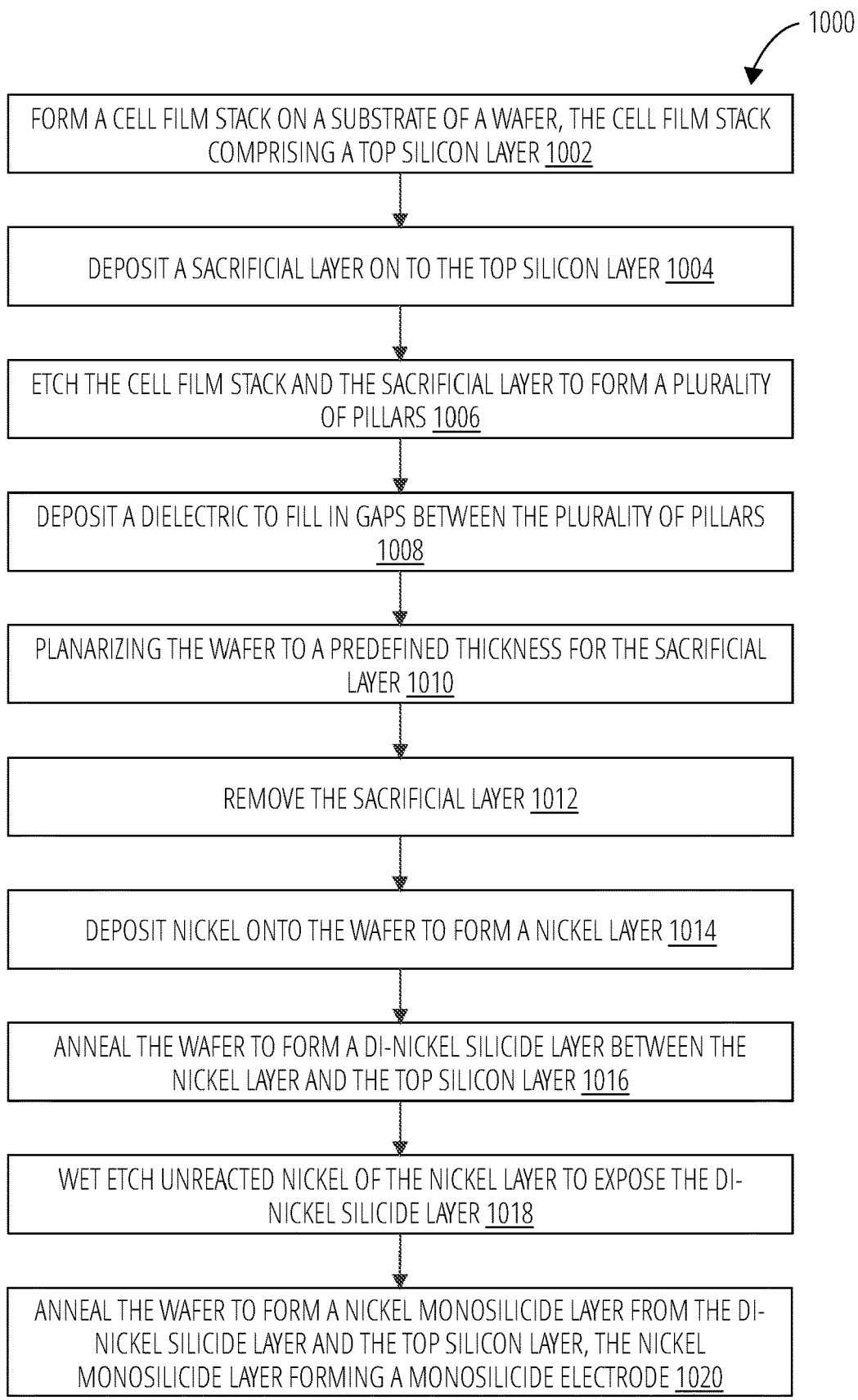
FIG. 10 illustrates a method of making a low resistance monosilicide electrode 1000 in accordance with one embodiment.

FIG. 10 illustrates a method of making a low resistance monosilicide electrode 1000 in accordance with one embodiment. This method begins at block 1002 with formation of a cell film stack on a substrate of a wafer. The cell film stack comprises a top silicon layer. At block 1004, a sacrificial layer is deposited on to the top silicon layer.

At block 1006, etching the cell film stack and the sacrificial layer forms a plurality of pillars. In block 1008, a dielectric is deposited to fill in gaps between the plurality of pillars left by the etching. In block 1010, planarizing the wafer yields a sacrificial layer of a predefined thickness. The remaining sacrificial layer is removed in block 1012.

In one embodiment, block 1004 and block 1012 may be omitted, and the monosilicide electrode may be generated without use of a sacrificial layer. In such an embodiment, the monosilicide electrode of the bit line or word line may be formed using a thermal solid-state reaction process. A silicon layer may be deposited on a substrate such as a carbon 224 layer (See FIG. 2). Next, a gap, such as gap 508, may be etched in the silicon layer, which is a top silicon layer. The gap comprises at least two walls, such as walls 506, and a bottom. The at least two walls may comprise dielectric and the bottom may comprise the top silicon layer. Nickel (as well as titanium nitride, in certain embodiments) may be deposited over the gap and annealed with the top silicon layer to form a di-nickel silicide layer between the nickel layer and the top silicon layer using a thermal solid-state reaction. Unreacted nickel (as well as titanium nitride, in certain embodiments) may be wet etched to expose the di-nickel silicide layer, and the di-nickel silicide layer and top silicon layer may be further annealed to form a nickel monosilicide layer using a thermal solid-state reaction.

At block 1014, nickel deposition is used to form a nickel layer on the wafer. In certain embodiments, block 1014 may also include deposition of a titanium nitride capping layer on top of the nickel layer. At block 1016, the wafer may be annealed to form a di-nickel silicide layer between the nickel layer and the top silicon layer. Wet etching in block 1018 removes the unreacted nickel of the nickel layer to expose the di-nickel silicide layer. In an embodiment includes a titanium nitride layer 404, block 1018 may also include wet etching to remove the titanium nitride layer 404. At block 1020, the wafer is annealed further to form a nickel monosilicide layer from the di-nickel silicide layer and the remaining top silicon layer. The resultant nickel monosilicide layer forms a monosilicide electrode.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25% of a given dimension.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A method of forming a monosilicide electrode, comprising:

forming a cell film stack on a substrate of a wafer, the cell film stack having a top silicon layer;
etching the cell film stack to form a plurality of pillars;
depositing a dielectric to fill in gaps between the plurality of pillars;
planarizing the wafer to expose the top silicon layer; and
converting the exposed top silicon layer into a nickel monosilicide layer, the nickel monosilicide layer forming a monosilicide electrode.

2. The method of claim 1, wherein converting the exposed top silicon layer into the nickel monosilicide layer comprises:

depositing nickel onto the exposed top silicon layer to form a nickel layer;
heating the exposed top silicon layer and the nickel layer to about 350 degrees Celsius such that the nickel layer reacts with the exposed top silicon layer to form the nickel monosilicide layer;
removing unreacted nickel of the nickel layer; and
planarizing the wafer.

3. The method of claim 2, further comprising depositing titanium nitride on to the nickel layer, the titanium nitride forming a titanium nitride layer configured to prevent or mitigate oxidation of the nickel layer with oxygen and wherein the nickel layer is about 0.452 times the thickness of the nickel monosilicide layer and the exposed top silicon layer is about 0.828 times the thickness of the nickel monosilicide layer.

4. The method of claim 2, wherein removing the unreacted nickel comprises wet etching with a mixture of sulfuric acid and hydrogen peroxide.

5. The method of claim 2, wherein planarizing the wafer comprises applying a nickel monosilicide chemical mechanical polishing process to the wafer.

6. The method of claim 2, wherein planarizing the wafer comprises:

depositing a dielectric film onto the nickel monosilicide layer; and
applying a dielectric chemical mechanical polishing process to the wafer.

7. The method of claim 1, wherein the nickel monosilicide layer substantially replaces the exposed top silicon layer.

8. The method of claim 1, wherein converting the exposed top silicon layer into the nickel monosilicide layer creates a protrusion from one or more portions of the nickel monosilicide layer, the protrusion extending above a surface of the wafer and the method further comprises planarizing the nickel monosilicide layer to remove the protrusion.

* * * * *